(12) United States Patent
Mahanpour et al.

(10) Patent No.: US 6,528,332 B2
(45) Date of Patent: Mar. 4, 2003

(54) METHOD AND SYSTEM FOR REDUCING POLYMER BUILD UP DURING PLASMA ETCH OF AN INTERMETAL DIELECTRIC

(75) Inventors: Mehrdad Mahanpour, Union City, CA (US); Mohammad Massoodi, Los Altos, CA (US); Jose Hulog, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/844,689

(22) Filed: Apr. 27, 2001

(65) Prior Publication Data

US 2002/0158247 A1 Oct. 31, 2002

(51) Int. Cl.$^7$ .............................................. H01L 21/66
(52) U.S. Cl. ........................ 438/15; 438/257; 438/259; 438/264; 216/68; 216/67; 216/79
(58) Field of Search ............................... 438/257, 259, 438/264; 216/68, 67, 79

(56) References Cited

U.S. PATENT DOCUMENTS 6,046,085 A * 4/2000 Chan ........................... 216/67
6,238,588 B1 * 5/2001 Collins et al. ......... 204/192.32

* cited by examiner

Primary Examiner—David Nelms
Assistant Examiner—Mai-Huong Tran
(74) Attorney, Agent, or Firm—Sawyer Law Group LLP

(57) ABSTRACT

A method and system for deprocessing a semiconductor device is disclosed. The semiconductor device has a plurality of structures and an intermetal dielectric layer. The method and system include anisotropically plasma etching the intermetal dielectric layer at an oblique angle and rotating the semiconductor device during the plasma etch to reduce or eliminate build up of a material on the plurality of structures due to the plasma etch of the intermetal dielectric layer. In another aspect the method and system include a semiconductor device deprocessed using the method in accordance with the present invention. In another aspect, the present invention includes a system for deprocessing the semiconductor device.

6 Claims, 4 Drawing Sheets

METHOD AND SYSTEM FOR REDUCING POLYMER BUILD UP DURING PLASMA ETCH OF AN INTERMETAL DIELECTRIC

FIELD OF THE INVENTION

The present invention relates to semiconductor devices, and more particularly to a method and system for avoiding the build up of a polymer during a plasma etch of an intermetal dielectric when deprocessing the semiconductor device.

BACKGROUND OF THE INVENTION

FIG. 1 depicts a conventional method 10 for deprocessing a semiconductor device in order to investigate failures in semiconductor devices. Deprocessing removes portions of the semiconductor device to expose structures that are to be studied to determine whether a fault exists and, if so, the type of the fault. The conventional method 10 is described in conjunction with the semiconductor device 30 depicted in FIGS. 2A and 2B. Referring to FIG. 1, a top portion of the semiconductor device is thus removed to expose the intermetal dielectric layer, via step 12. The top portion of the semiconductor device may be mechanically removed or removed in another way. The intermetal dielectric layer exposed is a lower level, such as the intermetal dielectric one layer. The intermetal one dielectric layer insulates the first layer of metal ("metal 1") from the remainder of the semiconductor device. FIG. 2A depict the semiconductor device 30 after the intermetal dielectric layer 32 has been exposed in step 12. The semiconductor device 30 also includes a local interconnect 34 and a word line 36 above a substrate 31. The local interconnect 34 is included in the first metal layer.

In general, a reactive ion etch and more particularly an anisotropic plasma etch of the intermetal dielectric is performed at an angle perpendicular to the surface of the semiconductor device. However, in practice the plasma etches in an oblique angle, via step 14. An oblique angle is an angle that is greater than zero and smaller than 90 degrees from normal to the surface of the semiconductor device 30. Thus, the direction of the plasma etch is depicted by the arrow 38 in FIG. 2A. An oblique angle is caused by the magnets inside the system below the semiconductor device 30. The investigation of the exposed components and subsequent deprocessing can then be performed, via step 16.

FIG. 2B depicts the semiconductor device 30' after the plasma etch is performed in step 14. The intermetal dielectric 32 has been removed and thus is not present in FIG. 2B. Most of the word line 36' and the local interconnect 34' have been exposed. In addition, a material 40 and 42 has built up on the side of the local interconnect 34' and the word line 36'g respectively, that were shadowed from the direction of the plasma etch. The material 40 and 42 typically includes a polymer. The material 40 and 42 is due to the plasma etch of the intermetal dielectric 32.

Although the method 10 allows the semiconductor device 30 to be deprocessed, one of ordinary skill in the art will readily realize that the method 10 results in the build up of the material 40 and 42, described above. The material 40 and 42 may cover some or all of the sides of the local interconnect 34' and the word line 36'. In addition, the material may extend between the local interconnect 34' and the word line 36'. Because the material 40 and 42 covers at least a portion of the sides of the local interconnect 34' and the word line 36'g respectively, any faults at the sides of these local interconnect 34' and the word line 36' will remain hidden. Similarly, a short between the local interconnect 34' or the word line 36' and another structure may be hidden by the material 40 and 42, respectively. Thus, the method 10 may miss some defects in the semiconductor device 30.

Accordingly, what is needed is a system and method for deprocessing semiconductor devices, particularly at lower layers that allows faults to be uncovered. The present invention addresses such a need.

SUMMARY OF THE INVENTION

The present invention provides a method and system for deprocessing a semiconductor device. The semiconductor device has a plurality of structures and an intermetal dielectric layer. The method and system comprise anisotropic plasma etching the intermetal dielectric layer at an oblique angle and rotating the semiconductor device during the plasma etch to reduce or eliminate build up of a material on the plurality of structures due to the plasma etch of the intermetal dielectric layer. In another aspect the method and system include a semiconductor device deprocessed using the method in accordance with the present invention. In another aspect, the present invention comprises a system for deprocessing the semiconductor device. The system includes a chamber having a cavity therein for retaining the semiconductor device during a plasma etch of the intermetal dielectric layer. The system also includes a sample holder, coupled with the chamber, for holding the semiconductor device in the chamber and at least one magnet disposed outside of the chamber. In such a system the sample holder is capable of rotating the semiconductor device during the plasma etch to reduce or eliminate build up of a material on the plurality of structures due to the plasma etch of the intermetal dielectric layer without rotating the at least one magnet.

According to the system and method disclosed herein, the present invention allows a semiconductor device to be deprocessed while reducing the build up of a material during deprocessing.

DETAILED DESCRIPTION OF THE INVENTION

Figure 1:
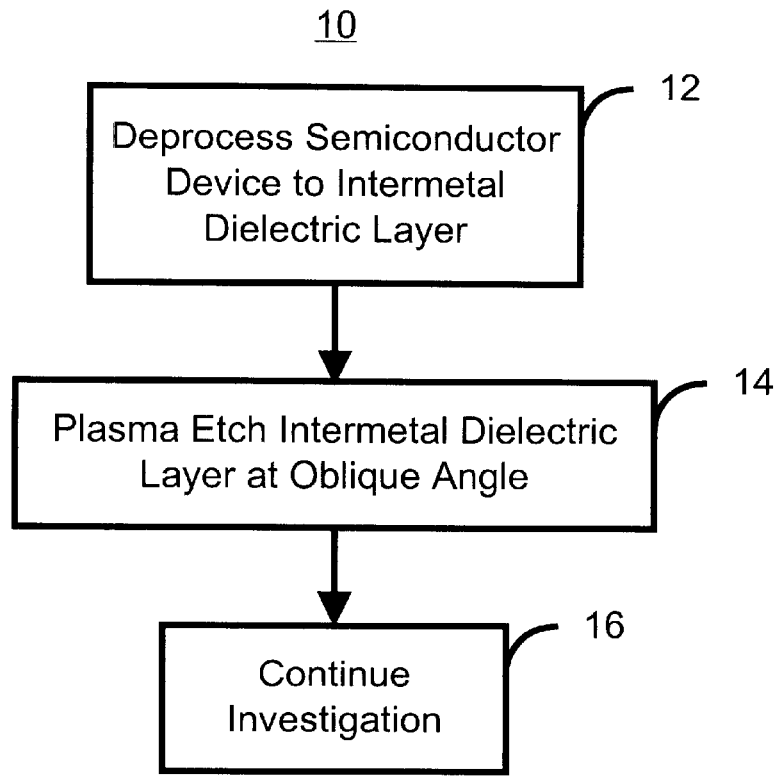
FIG. 1 is a flow chart of a conventional method for deprocessing a semiconductor device.

The present invention relates to an improvement in deprocessing of semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

In order to detect faults, semiconductor devices are deprocessed. Once the lower intermetal dielectric layer, such as the intermetal dielectric one layer, is exposed, this intermetal dielectric layer is anisotropically plasma etched. The anisotropic plasma etch is typically performed at an oblique angle and is used to remove the intermetal dielectric layer, exposing the underlying components. Although the intermetal dielectric layer is removed, there is a build up of a material on one side of the underlying components. For example, underlying interconnects or contacts might have the material on one side. In addition, the material might stretch between components. Typically this material includes a polymer. The material may also hide defects on or between the components. Consequently, an investigator may not be able to discover and adequately study these hidden defects.

The present invention provides a method and system for deprocessing a semiconductor device. The semiconductor device has a plurality of structures and an intermetal dielectric layer. The method and system comprise anisotropically plasma etching the intermetal dielectric layer at an oblique angle and rotating the semiconductor device during the plasma etch to reduce or eliminate build up of a material on the plurality of structures due to the plasma etch of the intermetal dielectric layer. In another aspect the method and system include a semiconductor device deprocessed using the method in accordance with the present invention. In another aspect, the present invention comprises a system for deprocessing the semiconductor device. The system includes a chamber having a cavity therein for retaining the semiconductor device during a plasma etch of the intermetal dielectric layer. The system also includes a sample holder, coupled with the chamber, for holding the semiconductor device in the chamber and at least one magnet disposed outside of the chamber. In such a system the sample holder is capable of rotating the semiconductor device during the plasma etch to reduce or eliminate build up of a material on the plurality of structures due to the plasma etch of the intermetal dielectric layer without rotating the at least one magnet.

The present invention will be described in terms of a particular method and a particular device. However, one of ordinary skill in the art will readily recognize that this method and system will operate effectively for other methods and devices consistent with the present invention. Furthermore, one of ordinary skill in the art that, for clarity, certain components and steps have been omitted from the method, the device and the system in accordance with the present invention. For example, the semiconductor device could include contacts, floating gates, source and drain regions or other structures.

Figure 3:
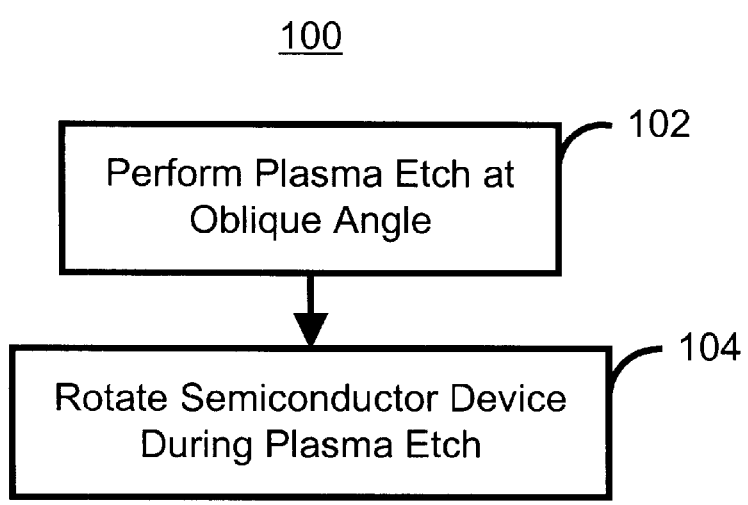
FIG. 3 is a high level flow chart of one embodiment of a method in accordance with the present invention for deprocessing a semiconductor device.

To more particularly illustrate the method and system in accordance with the present invention, refer now to FIG. 3, depicting one embodiment of a method 100 in accordance with the present invention for deprocessing a semiconductor device. The method 100 preferably commences after a portion of the semiconductor device has been removed, for example through mechanical polishing, to expose an intermetal dielectric layer. The intermetal dielectric layer is preferably a lower level intermetal dielectric. In a preferred embodiment, the intermetal dielectric layer is an intermetal dielectric one layer that insulates the first metal layer.

After the intermetal dielectric layer is exposed, the semiconductor device is anisotropically plasma etched at an oblique angle, via step 102. The oblique angle plasma etch is used to remove at least a portion, and preferably all, of the intermetal dielectric layer. The semiconductor device is also rotated during the plasma etch, via step 104. In a preferred embodiment the semiconductor device is manually rotated in step 104. However, nothing prevents the semiconductor device from being rotated in another manner. In one embodiment, the semiconductor device is rotated by a particular angle each and rotated a particular number of times. Also in a preferred embodiment, the semiconductor device is rotated four times, at an angle of ninety degrees each time. However, nothing prevents the semiconductor device from being rotated in another manner. For example, in one embodiment, the semiconductor device is rotated continuously. In another embodiment, the semiconductor device may be rotated by varying angles or with a varying angular velocity. The plasma etching at an oblique angle in step 102 in combination with the rotating of step 104 are carried out until the desired amount of the intermetal dielectric layer has been removed. In a preferred embodiment, steps 102 and 104 are carried out until the intermetal dielectric layer has been completely removed to expose the underlying structures.

Because the semiconductor device is rotated in step 104, different sides of the semiconductor device are directly exposed to the plasma etch. As a result, the build up of material, primarily a polymer, on a side of the structures under the intermetal dielectric layer being etched is reduced or eliminated. Consequently, all sides of the underlying structures are exposed for study. Thus, defects on these portions of the underlying structures can be detected and studied.

Figure 4:
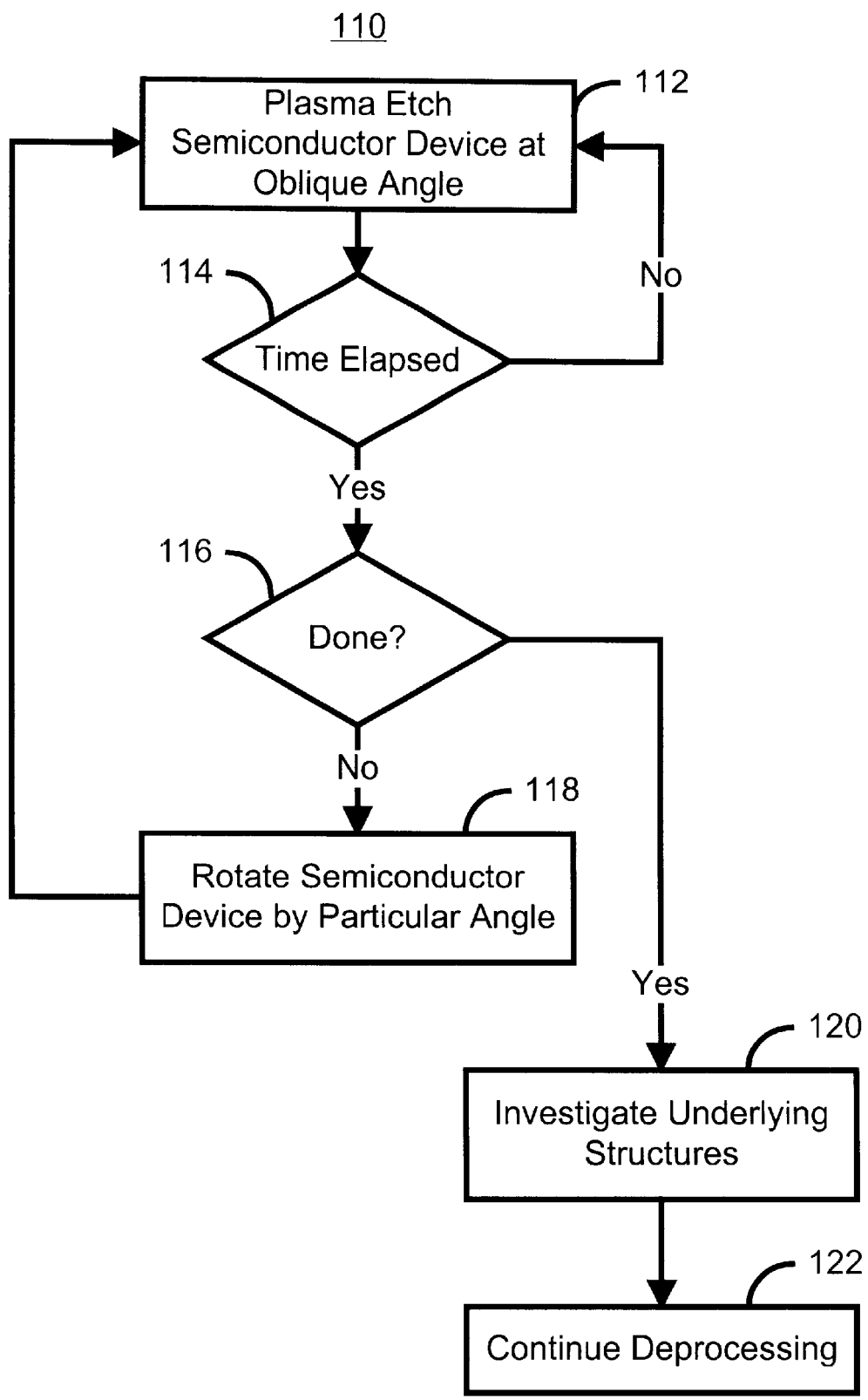
FIG. 4 is a more detailed flow chart of one embodiment of a method in accordance with the present invention for deprocessing a semiconductor device.
Figure 5A:
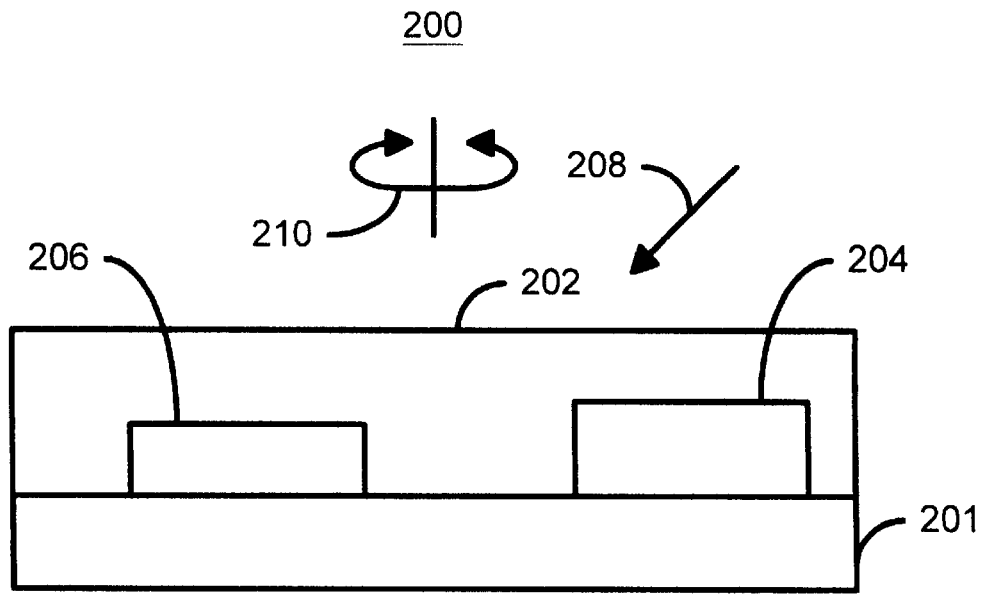
FIG. 5A is a diagram of a semiconductor device in accordance with the present invention after removal of upper layers of the semiconductor device.

FIG. 4 depicts a more detailed flow chart of one embodiment of a method 110 in accordance with the present invention. The method 110 preferably commences after a portion of the semiconductor device has been removed, for example through mechanical polishing, to expose an intermetal dielectric layer. The intermetal dielectric layer is preferably a lower level intermetal dielectric. In a preferred embodiment, the intermetal dielectric layer is an intermetal dielectric one layer that insulates the first metal layer. The method 110 is described in conjunction with FIGS. 5A and 5B. FIG. 5A depicts one embodiment of the semiconductor device 200 in accordance with the present invention. The semiconductor device 200 includes a substrate 201, an intermetal dielectric layer 202 and underlying structures 204 and 206. In the embodiment shown, the underlying structures 204 and 206 are a local interconnect 204 and a word line 206. However, nothing prevents the underlying structures 204 and 206 from including other structures (not shown).

Referring to FIGS. 4 and 5A, the intermetal dielectric layer is plasma etched at an oblique angle, via step 112. One oblique angle of the plasma etch is shown by the arrow 208. Thus, the plasma etch is performed at an angle from normal to the surface of the semiconductor device 200. It is determined whether a particular time has elapsed, via step 114. In one embodiment, the particular time is the total time for plasma etching the intermetal dielectric layer 202 divided by a number of times the semiconductor device is to be rotated. In a preferred embodiment, the semiconductor device 200 is to be rotated four times, at an angle of approximately ninety degrees each time. Also in a preferred embodiment, the total time for which the intermetal dielectric layer 202 is etched is four to six minutes and removed completely. In such an embodiment, therefore, step 114 determines whether one to one and one-quarter of a minute has passed. If the particular time has not elapsed, then plasma etching continues in step 112 until the particular time is reached. Once it is determined that the particular time has elapsed, it is determined whether the plasma etch of the intermetal dielectric layer 202 is complete, via step 116. In a preferred embodiment, the plasma etch is complete if all of the intermetal dielectric layer 202 is completed. If the plasma etch is not complete, then the semiconductor device 200 is rotated through a particular angle, via step 118. The etching step 112 is then returned to.

FIG. 5A also depicts the direction of rotation with arrow 210. This direction 210 is around an axis substantially normal to the surface of the semiconductor device 200. In one embodiment, the angle through which the semiconductor device 200 is rotated is three hundred and sixty degrees divided by the number of times the semiconductor device 200 is rotated. In a preferred embodiment, the particular angle is approximately ninety degrees.

Referring back to FIG. 4, if it is determined that the etching is completed, then the desired structures are investigated, via step 120. In a preferred embodiment, the intermetal dielectric layer is removed completely. Thus, the structures investigated in step 120 are the underlying structures, such as polysilicon structures or interconnects. Step 120 generally includes viewing portions of the exposed structures to detect and study any faults. Any subsequent investigation of the semiconductor device can be performed later, via step 122.

Figure 2A:
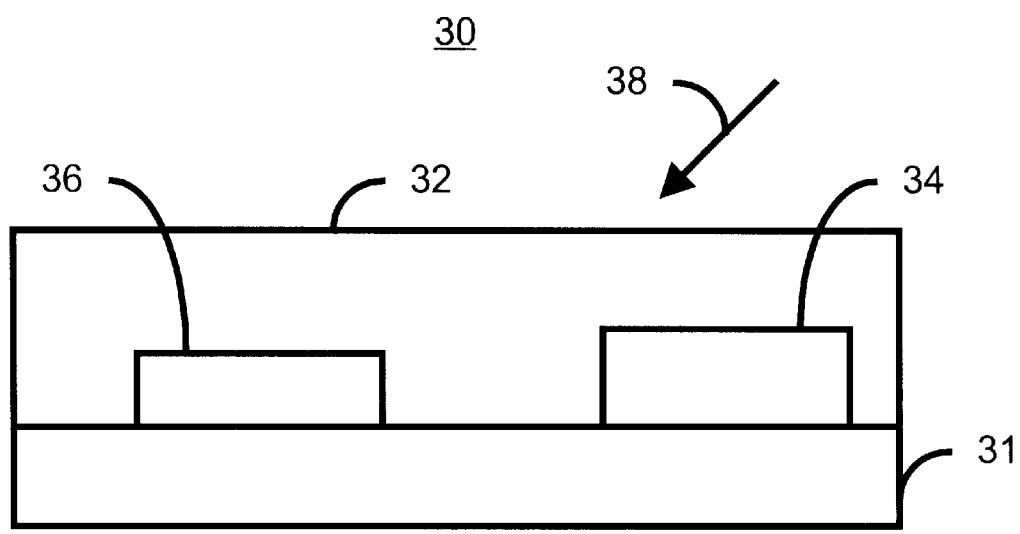
FIG. 2A is a diagram of the semiconductor device after removal of upper layers of the semiconductor device.
Figure 2B:
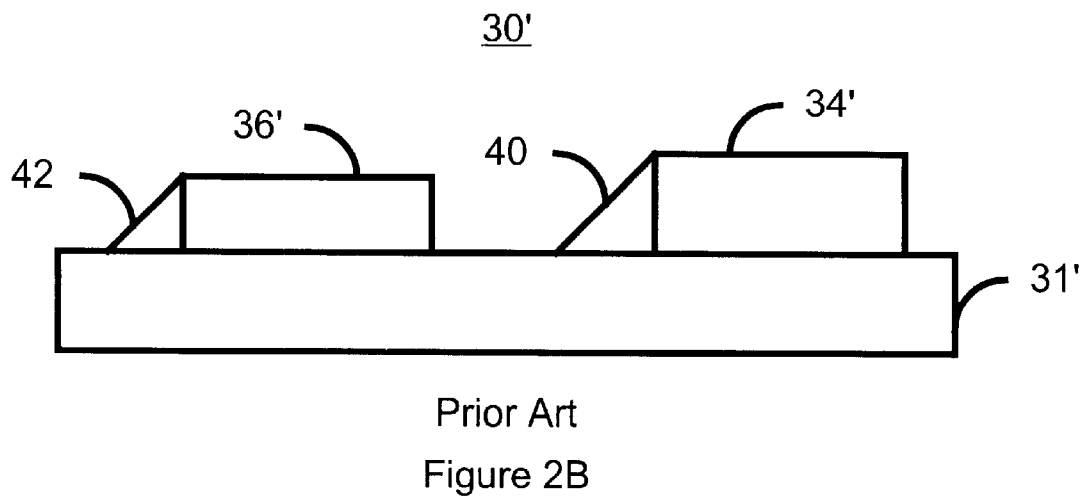
FIG. 2B is a diagram of the semiconductor device after removal of the intermetal dielectric layer using a conventional method.
Figure 5B:
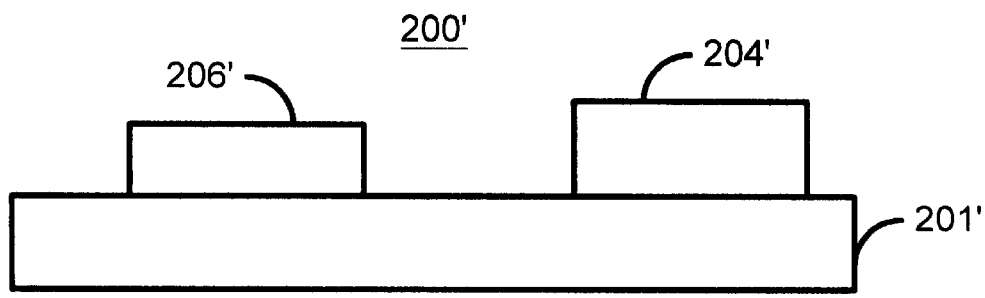
FIG. 5B is a diagram of the semiconductor device in accordance with the present invention after removal of the intermetal dielectric layer using a conventional method.

FIG. 5B depicts the semiconductor device 200' after removal of the intermetal dielectric layer 202. The underlying structures, polysilicon 206' and local interconnect 204', have been exposed. Moreover, because of the rotations performed in step 118 the build up of the polymer (depicted in FIG. 2B) has been reduced or, as shown in FIG. 5B, eliminated. As a result, the sides of the local interconnect 204' and the polysilicon 206' can be investigated. Thus, defects in the sides of the local interconnect 204' and the word line 206' can be detected and examined. Furthermore, the surface of the substrate 201' (or any other exposed surface) can be studied. As a result, shorts between the structure 206' and 204' can be located and investigated. Consequently, deprocessing of the semiconductor device 20 is improved.

Figure 6:
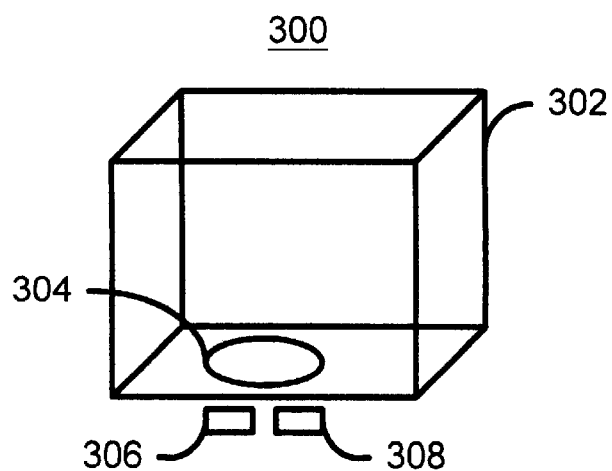
FIG. 6 is a diagram of one embodiment of a system for deprocessing a semiconductor device in accordance with the present invention.

FIG. 6 is a simplified diagram of a system 300 in accordance with the present invention for deprocessing a semiconductor device. The system 300 includes a chamber 302 for providing an anistropic plasma etch at an oblique angle. The chamber includes a sample holder 304, which may be a plate with some mechanism (not shown) for holding the semiconductor device 200 in place. The sample holder 304 is rotatable, preferably around a central axis (not shown). In one embodiment, the sample holder 304 resides on a larger graphite plate (not shown). The system 300 includes magnets 306 and 308, which may be used in providing a higher ion density or etch rate. The magnets 306 and 308 are preferably below the semiconductor device and outside of the chamber 302. The sample holder 304 can rotate independently of the magnets 306 and 308. In one embodiment, the semiconductor device 200 is manually rotated. In another embodiment, the semiconductor device is automatically rotated using the sample holder 304. The sample holder 304 may rotate continuously during the plasma etch or the sample holder 304 may go through a number of discrete rotations through a particular angle.

Thus, the system 300 and method 100 and 110 allow the semiconductor device 200 20 to be deprocessed while reducing or eliminating the build up of a material due to removal of the intermetal dielectric layer 202. Thus, additional defects may be exposed. The semiconductor device 200, therefore, can be better studied.

A method and system has been disclosed for deprocessing a semiconductor device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of deprocessing a semiconductor device having a plurality of structures and an intermetal dielectric layer, the method comprising the steps of:

(a) anisotropic plasma etching the intermetal dielectric layer at an oblique angle; and (b) rotating the semiconductor device during the plasma etch to reduce or eliminate build up of a material on the plurality of structures due to the plasma etch of the intermetal dielectric layer.

2. The method of claim 1 wherein the rotating step (b) further includes the steps of:

(b1) performing a plurality of rotations of the semiconductor during the plasma etch, each rotation of the plurality of rotations being through a particular angle.

3. The method of claim 2 wherein the plurality of rotations include four rotations and wherein the particular angle is ninety degrees.

4. The method of claim 2 wherein each of the plurality of rotations is performed after a particular time.

5. The method of claim 4 wherein the plurality of rotations include four rotations, wherein the particular angle is ninety degrees and wherein the particular time is between one minute and two minutes.

6. The method of claim 1 wherein the semiconductor device resides on a sample holder above at least one magnet and wherein the rotating step (b) further includes the step of:

(b1) rotating the sample holder without rotating the at least one magnet.

* * * * *